United States Patent
Nowak et al.

(10) Patent No.: US 6,794,718 B2
(45) Date of Patent: Sep. 21, 2004

(54) HIGH MOBILITY CRYSTALLINE PLANES IN DOUBLE-GATE CMOS TECHNOLOGY

(75) Inventors: Edward J. Nowak, Essex Juction, VT (US); BethAnn Rainey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/248,123

(22) Filed: Dec. 19, 2002

(65) Prior Publication Data

US 2004/0119100 A1 Jun. 24, 2004

(51) Int. Cl.[7] .................. H01L 27/12; H01L 31/0392
(52) U.S. Cl. .................. 257/347; 438/149; 438/479
(58) Field of Search .................. 438/479, 149, 438/517; 257/347, 401, 627, 628

(56) References Cited

U.S. PATENT DOCUMENTS

| | | | |
|---|---|---|---|
| 3,603,848 A | 9/1971 | Kohoku-ku et al. | 317/235 |
| 4,768,076 A | 8/1988 | Aoki et al. | 357/42 |
| 4,857,986 A | 8/1989 | Kinugawa | 357/42 |
| 4,933,298 A | * 6/1990 | Hasegawa | |
| 5,293,052 A | 3/1994 | Chorne et al. | 257/349 |
| 5,317,175 A | 5/1994 | Throngnumchai | 257/255 |
| 5,497,019 A | 3/1996 | Mayer et al. | 257/347 |
| 5,666,311 A | 9/1997 | Mori | 438/257 |

(List continued on next page.)

FOREIGN PATENT DOCUMENTS

| | | | |
|---|---|---|---|
| JP | 61070748 A | * | 4/1986 |
| JP | 1264254 A | * | 10/1989 |
| JP | 3285351 A | * | 12/1991 |

OTHER PUBLICATIONS

Takagi et al., "On the Universality of Inversion Layer Mobility in Si MOSFET's: Part 1—Effects of Substrate Imurity Concentration", IEEE Transaction son Electron Devies, vol. 41, No. 12, Dec. 1994, pp. 2357–2362.*

Takagi et al., "On the Uniersality of Inversion Layer Mobility in Si MOSFET's: Part II—Effects of Surface Orientation", IEEE Transactions on Electron Devies, vol. 41, No. 12, Dec. 1994, pp. 233–2368.*

Tang et al., "FinFET—A Quasi–Planar–Gate MOSFET", ISSCC 2001/Session7/Technology Directions, Advanced Technologies/7.4, Feb. 6, 2001, pp. 118–119, p. 437.

(List continued on next page.)

Primary Examiner—Nathan J. Flynn
Assistant Examiner—Kevin Quinto
(74) Attorney, Agent, or Firm—William D. Sabo

(57) ABSTRACT

A MOS device with first and second freestanding semiconductor bodies formed on a substrate. The first freestanding semiconductor body has a first portion thereof disposed at a non-orientation orthogonal, non parallel orientation with respect to a first portion of the second freestanding semiconductor body. These portions of said first and second freestanding semiconductor bodies have respective first and second crystalline orientations. A first gate electrode crosses over at least part of said first portion of said first freestanding semiconductor body at a non-orthogonal angle, as does a second gate electrode over the first portion of the second freestanding semiconductor body.

43 Claims, 5 Drawing Sheets

U.S. PATENT DOCUMENTS

| | | | |
|---|---|---|---|
| 5,698,893 A | 12/1997 | Perera et al. | 257/627 |
| 5,729,045 A | 3/1998 | Buynoski | 257/627 |
| 5,858,841 A | 1/1999 | Hsu | 438/278 |
| 5,945,690 A | 8/1999 | Saito et al. | 257/94 |
| 5,960,271 A | 9/1999 | Wollesen et al. | 438/197 |
| 5,970,330 A | 10/1999 | Buynoski | 438/198 |
| 6,064,090 A | 5/2000 | Miyamoto et al. | 257/347 |
| 6,121,651 A | 9/2000 | Furukawa et al. | 257/296 |
| 6,164,781 A * | 12/2000 | Tsang et al. | |
| 6,190,949 B1 | 2/2001 | Noguchi et al. | 438/149 |
| 6,194,273 B1 | 2/2001 | Matsuura et al. | 438/270 |
| 6,261,886 B1 | 7/2001 | Houston | 438/217 |
| 6,300,182 B1 * | 10/2001 | Yu | |

OTHER PUBLICATIONS

Hieda et al, "Effects of a New Trench–Isolated Transistor Using Sidewall Gates", IEEE Transactions of Electron Devies, vol. 36, No. 9, Sep. 1989, pp. 1615–1618.

Shibahara et al., IGDRAM Cell with Diagonal Bit–Line (DBL) Configuration and Edge Operation MOS (EOS) FET, Electron Devices Meeting, 1994, Technical Digest, International. 1994, pp. 639–642.

Hunter et al., "A New Edge–Defined Approach for Submicrometer MOSFET Fabrication", IEEE Electron Device Letters, vol. EDL–1, Jan. 1981, pp. 4–6.

* cited by examiner

HIGH MOBILITY CRYSTALLINE PLANES IN DOUBLE-GATE CMOS TECHNOLOGY

CROSS-REFERENCE TO RELATED APPLICATIONS

Reference is made to co-pending U.S. patent applications 10/011,846, entitled "Multiple-Plane FinFET CMOS", filed 4 Dec. 2001, and 10/063,330, "Fin Memory Cell and Method of Fabrication," filed 12 Apr. 2002, both of which are assigned to the assignee of the present invention.

BACKGROUND OF THE INVENTION

1. Technical Field of the Present Invention

The present invention generally relates to CMOS technology and very-large-scale integrated circuits and more specifically, to methods and structures that enable the use of high-mobility crystalline planes in double-gate CMOS technology.

2. Description of Related Art

Complementary Metal Oxide Semiconductor (CMOS) has been the technology of choice for Very-Large-Scale Integration (VLSI) wherein literally tens of millions of transistors (or more) can be fabricated to form a single integrated circuit.

In order to provide greater numbers of transistors with greater speed, one option that has been proposed in the art is to utilize freestanding silicon rails as the body for the transistor. These bodies, or so-called 'fins', are perpendicular to the plane defined by the wafer surface. See for example U.S. Pat. No. 6,252,284 to Muller, et al. Double-gated transistors constructed with such fins can provide lower leakage currents and are scalable to smaller gate lengths. See Tang et al, "FinFET—A Quasi-Planr Double-Gate MOSFET," 2001 IEEE International Solid State Circuits Conference, Paper 7.4.

It is further understood that in semiconducting crystals such as silicon, the mobility of holes and electrons is a function of the crystalline plane in which the channel of the transistor is formed. For instance in silicon, electrons have their greatest mobility in {100}-equivalent planes while holes have their greatest mobility in {100}-equivalent planes, as discussed by Takagi, et al., "On the Universality of Inversion Layer Mobility in Si MOSFETs: Part I—Effects of Substrate Impurity Concentration," 1994 IEEE Trans. on Electron Devices, V. 41, No. 12, December 1994, pp. 2357–2368. Other types of semiconductor substrates (e.g. gallium arsenide) typically have differing electron/hole mobilities in different planes.

As a practical matter it has proven to be difficult to form NFETs and PFETs on different planes without decreasing device density and/or increasing process complexity. For example, in U.S. Pat. No. 4,933,298 silicon islands on a SOI substrate are selectively masked and recrystallized to form islands of different crystal orientation, which increases process cost. In U.S. Pat. No. 5,317,175 the respective n and p devices are formed in separate areas of the substrate, orthogonal to one another, sacrificing density. In U.S. Pat. No. 5,698,893, as well as Japanese Published Patent Applications JP 1264254A and JP 3285351A, the respective devices are formed on horizontal and vertical surfaces of the substrate; trench formation increases process complexity and expense.

It would, therefore, be a distinct advantage to provide freestanding semiconductor bodies with p-type and n-type transistors having channels in different channel planes, in a manner that adds a minimum of process complexity and loss in density.

BRIEF SUMMARY OF THE INVENTION

In a first aspect, the invention comprises a MOS device, comprising first and second freestanding semiconductor bodies formed on a substrate, said first freestanding semiconductor body having a first portion thereof disposed at a non-orthogonal, non parallel orientation with respect to a first portion of said second freestanding semiconductor body, said portions of said first and second freestanding semiconductor bodies having respective first and second crystalline orientations; a first gate electrode crossing over at least part of said first portion of said first freestanding semiconductor body at a non-orthogonal angle with respect thereto; a second gate electrode crossing over at least part of said first portion of said second freestanding semiconductor body at a non-orthogonal angle with respect thereto; and controlled electrodes disposed at least in portions of said first and second freestanding semiconductor bodies exposed by said first gate electrode and said second gate electrode, respectively.

In a second aspect, the invention comprises a CMOS device, comprising a first freestanding semiconductor body with a n-type channel region disposed on a first crystalline plane that has greater electron mobility than that of a second crystalline plane of said first freestanding semiconductor body, a first gate electrode that crosses over said channel region at a non-orthogonal angle with respect thereto; a second freestanding semiconductor body with a p-type channel region disposed on a second crystalline plane that has a greater hole mobility than that of said first crystalline plane of said first freestanding semiconductor body, and a second electrode that crosses over said channel region at a non-orthogonal angle with respect thereto.

In a third aspect, the invention comprises a method of forming a MOS device, comprising forming a first freestanding semiconductor body with a n-type channel region disposed on a first crystalline plane that has greater electron mobility than that of a second crystalline plane of said first freestanding semiconductor body, and a first gate electrode that crosses over said channel region at a non-orthogonal angle with respect thereto, and source and drain regions; and forming a second freestanding silicon body with a p-type channel region disposed on a second crystalline plane that has a greater hole mobility than that of said first crystalline plane of said first freestanding semiconductor body, a second electrode that crosses over said channel region at a non-orthogonal angle with respect thereto, and source and drain regions.

In a fourth aspect, the invention comprises a method of providing a densely integrated circuit comprising first and second FinFETs with channel regions disposed on first and second crystal planes, comprising the steps of orienting a semiconductor wafer at a given axis; forming a first set of mask shapes at a first azimuthal angle with respect to said given axis; forming a second set of mask shapes at a second azimuthal angle with respect to said given axis; forming FinFET bodies in said semiconductor wafer by etching portions of the wafer exposed by said first and said second sets of mask shapes; and forming gate electrodes over said FinFET bodies at orientations that are favorable for lithographic control.

BRIEF DESCRIPTION OF THE SEVERAL VIEWS OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE INVENTION

In general, the present invention is a method and structure for providing dense packing of transistors with p-type channels of a first orientation, and n-type channels of a second orientation, with all other design features orthonormal (i.e. orthogonal) to each other. A {100} surfaced silicon wafer is oriented with {100} planes at 22.5 degrees with respect to a vertical reference axis that lies along the plane of the upper surface of the wafer, which results in {110} planes having an orientation that lies 22.5 degrees to the opposite direction of the vertical reference axis. Freestanding silicon bodies are formed along these respective planes according to whether they are used to build n-type or p-type FETs. The gate electrode layer is patterned along a direction orthonormal to (i.e. oriented 90 degrees with respect to) the vertical reference axis of the wafer, with the gate length being defined by the width of the gate electrode overlaying the freestanding silicon body.

The present invention can be fabricated on either a bulk silicon wafer or a silicon-on-insulator (SOI) wafer. In general, while SOI is preferred for its ease of fabrication of the freestanding silicon bodies as described below relative to bulk silicon wafers, bulk silicon wafers could also be used. In addition, while the invention is discussed relative to a silicon body, other semiconductor bodies (such as conventional single crystal germanium, compounds of silicon and germanium (e.g. strained silicon materials such as SiGe and SiGeC), Group III–V materials such as GaAs and InAs, or Group II–VI materials) could be used.

In the invention, freestanding rails of silicon are formed to provide the silicon bodies for double gated FETs (that is, FETs having gate electrodes that control the channel region in multiple dimensions, not just from the top down as in conventional FETs). As a practical matter, any process that would form such freestanding silicon bodies, with or without a double gated architecture, could be used. That is, while the preferred embodiment of the invention is to use finFETs, for their relative ease of construction as well as their resulting double gated architecture, other methods, structures, and architectures for forming FETs (or other active or passive integrated circuit components) on free-standing semiconductor bodies could be used.

In the description to follow, reference will be made to particular thicknesses, dimensions, and other parametrics for the various structures of the devices of the invention that are based on current semiconductor fabrication technologies as well as those that are foreseen in the future. It is to be understood that with future advances in process integration it may be possible to form the described structures using different/more advanced parametrics. The scope of the present invention is not to be interpreted as being limited to the parametrics set forth below.

Figure 1:
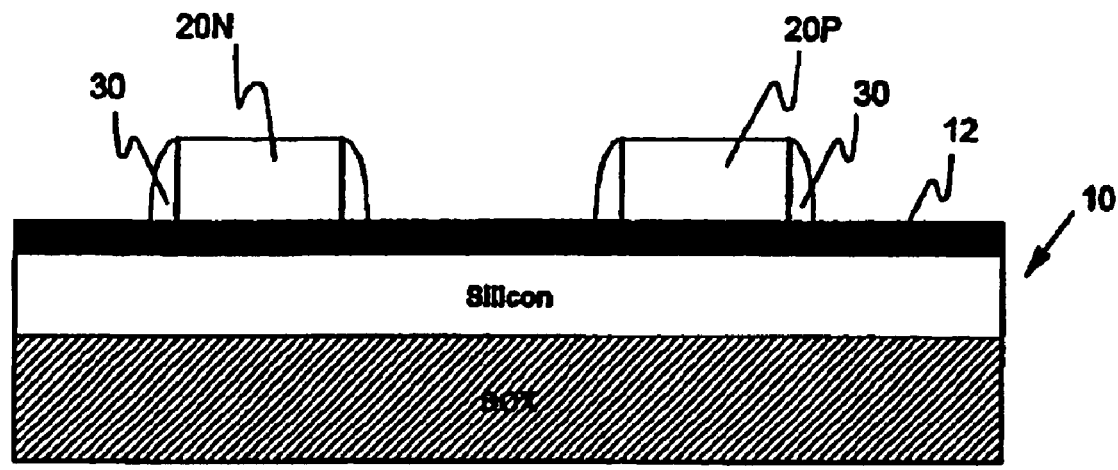
FIG. 1 is a cross-sectional view of an SOI wafer at a point in the process in accordance with a first embodiment of the present invention.

In accordance with a preferred embodiment of the invention, finFET silicon bodies are formed by the following process. First, an SOI substrate 10 is provided, having a given crystal orientation. The SOI wafer has a silicon layer of a thickness of approximately 10–120 nm on top of a buried oxide layer. The silicon layer is covered with a 4–50 nm thick layer of silicon oxide 12 (thermally grown on the silicon layer using conventional techniques), and a 6–75 nm thick layer of undoped polysilicon (or other material suitable for the process as described below) on the silicon oxide layer 12. Then a photomask is formed on the polysilicon, and the polysilicon layer is etched utilizing conventional techniques, stopping on the silicon oxide layer 12. Then as shown in FIG. 1, conventional processes are utilized to form silicon nitride sidewall spacers 30 on the sides of the etched polysilicon (mandrels) 20N and 20P. The spacers would be approximately 4–50 nm thick at their widest point (that is, just above the silicon oxide 12). Note that it is preferable for the thickness of the polysilicon layer to be on the order of 1.5× the thickness of the silicon nitride spacers; note also that it is preferable for the silicon nitride spacers to have the same general thickness as the silicon oxide 12. Note, however, that such interrelationships are not required.

Figure 2:
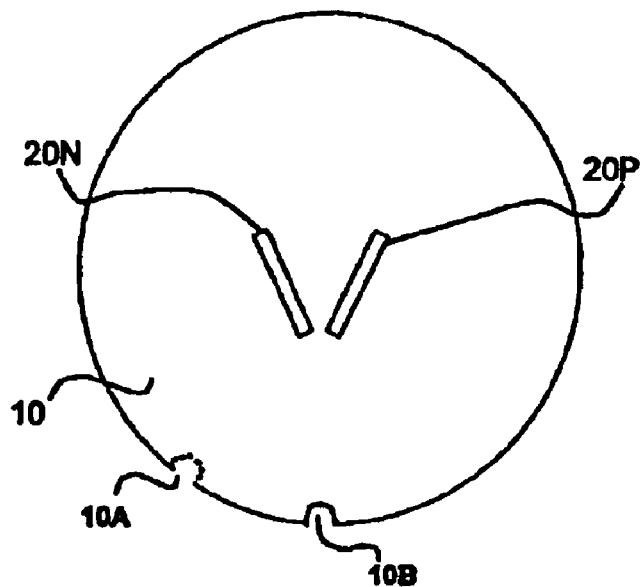
FIG. 2 is a top view of an SOI wafer at an intermediate step of the process in accordance with the first embodiment of the invention.

As shown in FIG. 2, note that from a top view the mandrels 20 are oriented on different angles, as a function of which device is ultimately formed. The mandrels 20N are oriented so that the resulting channel regions of the FET will be along the {100} plane of the silicon layer on SOI wafer 10, and are used to form n-type finFETs. The mandrels 20P are oriented so that the resulting channel regions of the FET will be along the {110} plane of the silicon layer on SOI wafer 10, and are used to form p-type finFETs. Since in silicon the {100} and {110} planes are oriented at 45 degrees with respect to one another, the mandrels 20N and 20P are likewise oriented at 45 degrees with respect to one another. As previously discussed, different semiconductors have different planes at which hole and electron mobility is greatest. Hence, as a practical matter, for other semiconductors the mandrels 20N and 20P may be disposed at angles other than 45 degrees with respect to one another. They would be disposed at whatever angles align with the respective crystal orientations that maximize hole and electron mobility, respectively. Also, while only two finFET bodies are shown, as a practical matter other bodies would be formed on the substrate, at either the same orientations or orientations orthonormal to one of the bodies 20N and 20P.

Working with silicon as the preferred embodiment, note that the SOI wafer 10 has a notch 10A. This notch is typically used to define the horizontal and vertical reference axes of the wafer during processing. Thus, for example, when the wafer is inserted into a photolithographic tool, the notch is used to define the vertical reference axis of the wafer, and the image is printed with that axis as a reference point. It is typical in CMOS technology to align the notch with the {110} crystal orientation of the wafer. In the invention, the notch is instead made at a location that lays 22.5 degrees away from the {100} plane.

Thus, the fins are generally oriented +/−22.5 degrees away from the four cardinal directions defined by the notch on the wafer. This will result in 'fins' of silicon with planes that lie in {110} or {100} planes according to whether they are 22.5 degrees clockwise or counterclockwise, respectively, from the vertical reference axis.

Figure 3A:
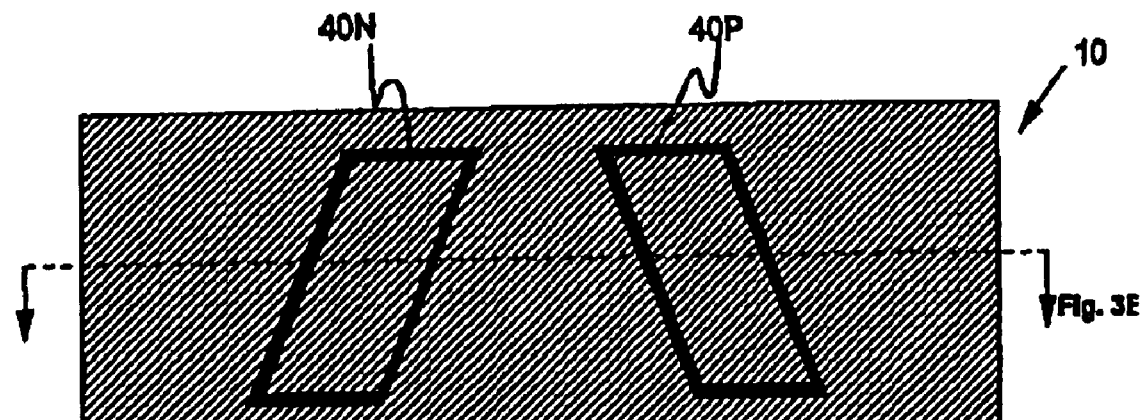
FIG. 3A is a top view.
Figure 3B:
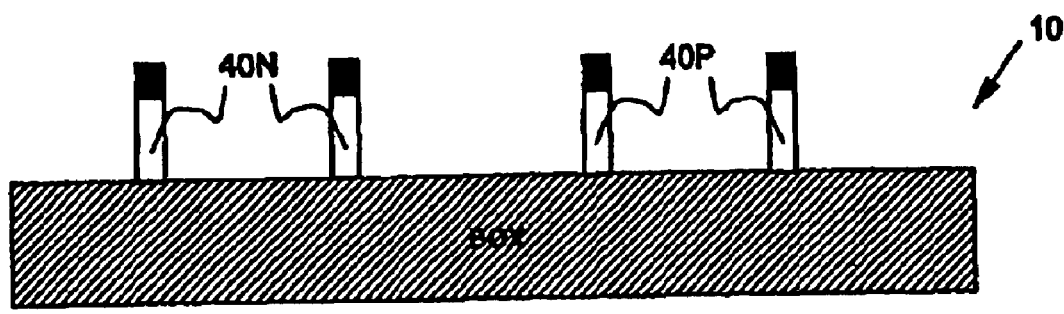
FIG. 3B is a cross sectional view, of an SOI wafer at an intermediate step of the process in accordance with the first embodiment of the present invention, subsequent to FIG. 2.

Returning to the process description, after the polysilicon mandrels 20N, 20P are removed, the silicon dioxide layer 12 and the underlaying silicon layer are etched to form the fin bodies, with the silicon nitride sidewalls 30 serving as a mask. Note that the combination of the nitride spacers 30 and the underlaying silicon oxide 12 collectively provide a hard mask that will maintain its dimensional integrity for the full etch of the silicon layer. Then the silicon nitride sidewall spacers 30 are removed, resulting in finFET silicon bodies 40N, 40P, each with a remaining amount of the silicon oxide layer 12 on its upper surface. The resulting structure is shown in FIG. 3A (top view) and FIG. 3B (cross sectional view). Note that because the bodies 40N, 40P are defined by sidewall spacers formed on a mandrel, they are in the form of loops. Various mask/etch sequences can be used at this juncture to etch away the connecting parts of the loops, to form discrete finFET bodies. For purposes of the invention the presence or absence of these loops is not material.

Figure 4A:
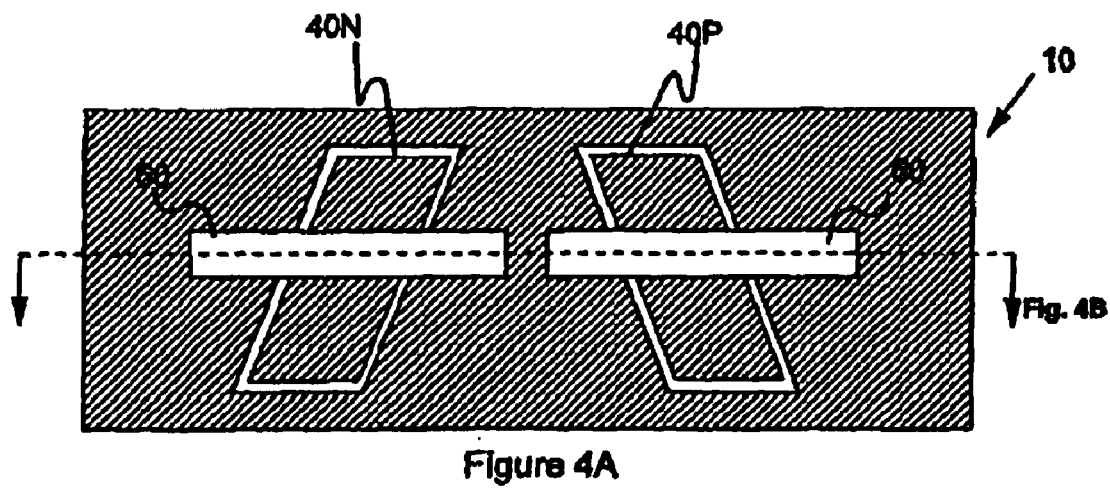
FIG. 4A is a top view.
Figure 4B:
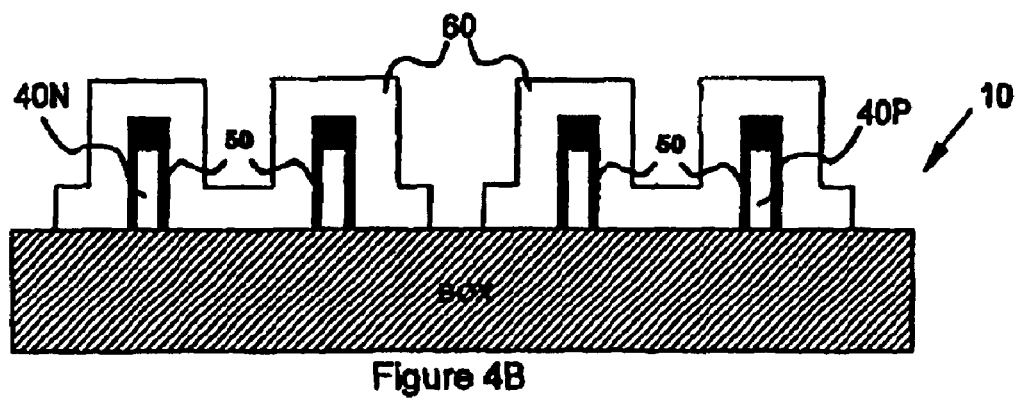
FIG. 4B is a cross sectional view, of an SOI wafer at an intermediate step of the process in accordance with the first embodiment of the present invention, subsequent to FIGS. 3A and 3B.

Then the finFET bodies 40N, 40P are doped in accordance with the product application. Assuming the silicon layer was originally p-doped, the finFET bodies 40N would be masked at this juncture and n-type dopant would be applied to the finFET bodies 40P. As shown in FIGS. 4A and 4B, after suitable body doping, a suitable silicon oxide gate dielectric 50 is formed in the finFET bodies (typically 1–2.5 nm thick, formed by thermal oxidation). Other gate dielectrics (silicon oxide and silicon nitride layers, or silicon oxy nitride, or any one of the high k gate oxide dielectrics that have been recently proposed such as halfnium oxide, aluminum oxide, zirconium oxide, and metal silicates) could be used. Then a gate electrode material, typically polysilicon is deposited to a thickness of 50–150 nm, and is then etched to form gates 60 having a given gate length (in this orientation, the width of the gate 60 in the vertical plane of FIG. 4A) of 7–180 nm. Gate length is a critical parameter in determining the speed and proper function of FETs and, in particular, FinFETs. The gates are oriented along the reference axes, and thus control of the gate length is not impaired by the off-axis orientation of the finFET bodies. Moreover, note that this and all subsequent mask and etching steps are carried out in alignment with the reference axis which is favorable for lithographic control.

Figure 5:
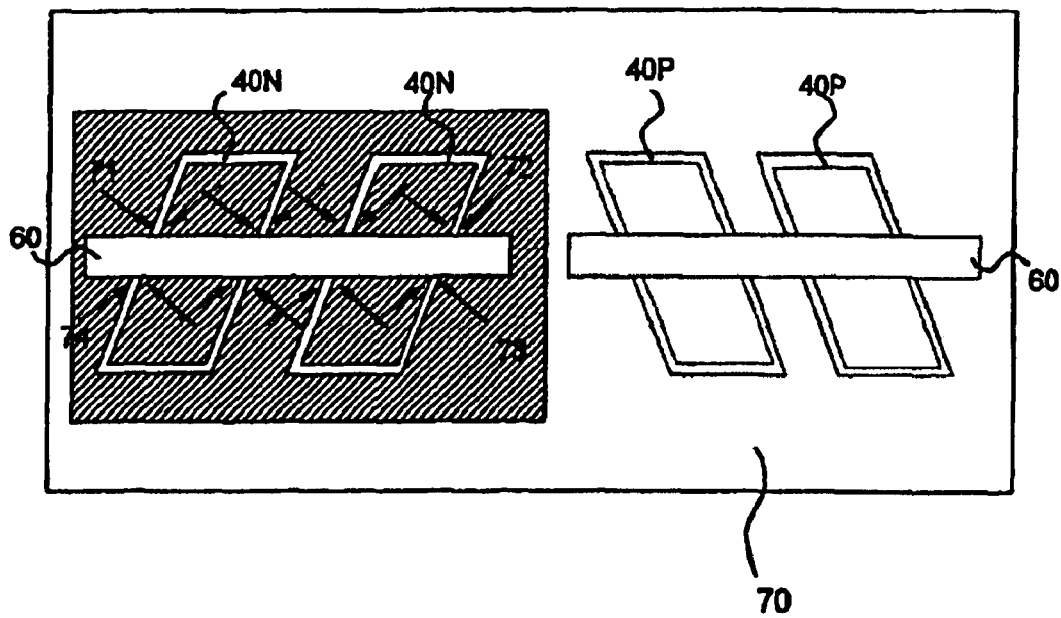
FIG. 5 is a top view of an SOI wafer bearing the integrated circuit structures in accordance with a first embodiment of the present invention.

In FIG. 5, source and drain extensions and halos are ion-implanted into finFETs 40N, with a masking layer 70 open only over regions where nFETs are designed. A like procedure is subsequently performed for pFETs and not illustrated. Note that each extension and halo implant is carried out as a sequence of implants, at orientations of approximately 150 degrees (implant 71), 30 degrees (implant 72), 210 degrees (implant 74, and 330 degrees (implant 73) with respect to the horizontal reference axis of the wafer, so as to completely dope both sides of the finFET bodies 40N. For the n devices, the extension implants are arsenic, at a dose on the order of 1 E 15 (that is 1×10 to the 15th power ions/cm squared) and an energy of approximately 0.5–15 kEV, and the halo implants are boron (B11) at a dose on the order of 4 E 13 and an energy of approximately 0.4–10 kEV. For the p device, the extension implants would be BF2 on the order of 1 E 15 and approximately 0.05–15 kEV, and the halo implants would be phosphorus, on the order of 5 E 13 to 1 E 14, and approximately 1–40 kEV. It is to be understood that all of these values are approximations, and are both technology and product dependent.

Then, after subsequent implantation of the source and drain regions 75, the finFETs are interconnected using conventional planarized back-end-of line (BEOL) passivation layers (e.g. boro-phosho-silicate glass, fluoro-silicate glass, and low-k dielectrics such as those sold under the trade names SILK and Black Diamond) and conductors 80 (doped silicon, aluminum, refractory metals and refractory metal alloys, copper and copper-based alloys). These structures can be single or dual Damascene (in which both the interconnecting stud and the metal line are formed by defining a via or groove into which the metal is deposited and subsquently planarized), or any other BEOL integration scheme that produces an interconnect density consistent with the density of the finFET bodies.

Figure 6:
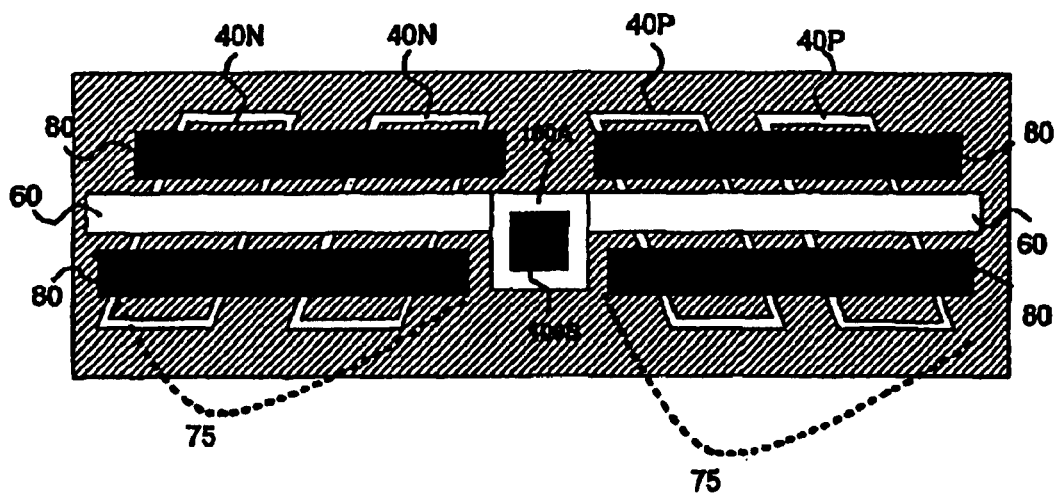
FIG. 6 is a layout for an inverter circuit in accordance with a first embodiment of the present invention.

Utilizing the process as set forth above, an inverter circuit can be formed having a topology as shown in FIG. 6. Note that the gate electrodes 60 are coupled to an overlaying metal stud 100B that contacts the gate electrode landing pad 100A. A feature of the process and structure of the invention is that the invention maximizes carrier mobility of the n and p devices while providing orthonormal shapes on all design levels except for the mandrel definition mask. Critical Image control for the fins is maintained in non-orthonormal directions by use of edge-defined lithography (in this embodiment, by sidewall-image-transfer (SIT) using the sidewall spacers as masks). Note that in the invention, carrier mobility has been maximized without the introduction of extra masking steps or other process complexity. At the same time, while density is compromised somewhat by the introduction of non-orthonormal features, the density reduction is less than that provided by prior art approaches because it is applied at a single mask level (the mask that defines the freestanding bodies), and is compensated for by the combination of increased carrier mobility for both the n and p devices and the use of freestanding FET bodies.

Figure 7:
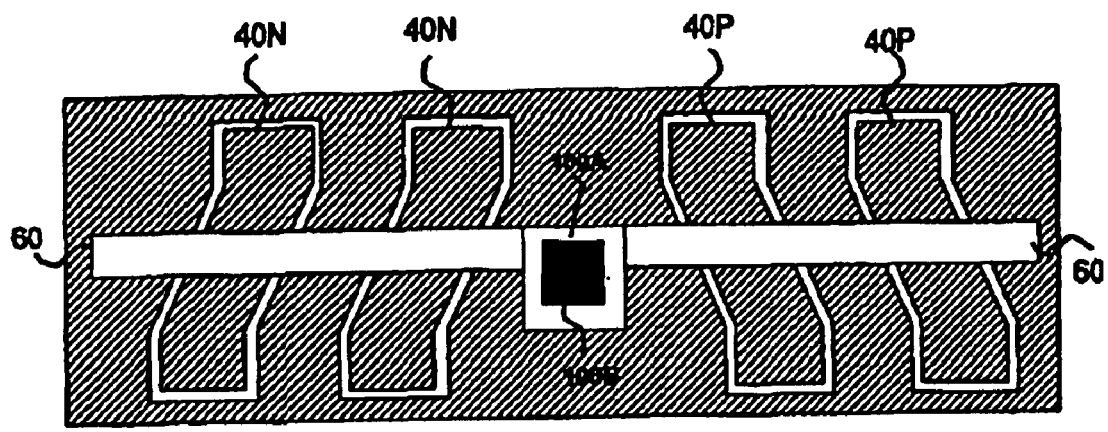
FIG. 7 illustrates a physical layout and structure according to a second embodiment of the present invention.

In FIG. 7 a second embodiment of the present invention is illustrated. In this embodiment, the detailed layout differs from that of the previous embodiment in that the freestanding FET bodies 40NA, 40PA are in directions orthonormal to the cardinal reference axes of the wafer, except in the immediate vicinity of where the gate electrodes and the FET bodies intersect. This "dogleg" layout topology provides a tradeoff; it increases density over the FET density provided by the first embodiment, but introduces process complexity to the masking step that defines the polysilicon mandrels. For example, this shape could be formed by carrying out two sequential masking/etching steps on the silicon nitride mandrels, offset from one another by the angle of the dogleg.

Figure 8:
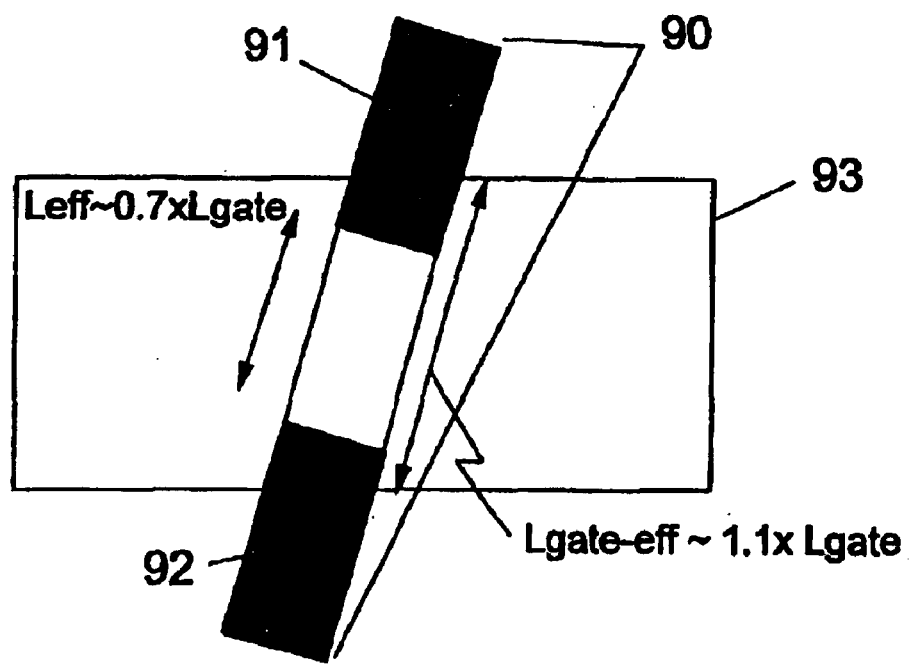
FIG. 8 is a top view of a freestanding FET device of the present invention, illustrating control of the electrical channel length thereof.

FIG. 8 illustrates the relationship between the effective channel length of the freestanding FETs fabricated according to the present invention with respect to that of a conventionally defined finFET. Gate-level lithography often limits the minimum image by which FET gate length is determined. Since the inventive FinFET silicon 90 fin crosses the gate at 67.5 degrees instead of the usual 90 degrees, the minimum physical length of the channel plane covered by the gate will be secant(22.5 degrees) times that of the conventional FET, or 9% greater. Diffusion of the source and drain regions conventionally extend under the gate edge approximately 10% (that is, of the total length of the gate, approximately 10% of it overlays e.g. a source region); therefore, in order to achieve LEFF of comparable value in the finFET of FIG. 8, processing would have to be modified to increase the distance of the source and drain diffusion under the gate to approximately 15%. As a practical matter the source and drain extensions of the invention can be further diffused beneath the edges of the gate electrode 93 using various techniques known in the art (e.g. extending the time or raising the temperature of the implant over conventional parameters). Thus the electrically effective channel length, LEFF, which determines the electrical behavior of the inventive FinFET, can be maintained equal to that of the conventional FinFET.

It will be readily apparent that various changes and/or modifications could be made herein without departing from the spirit and scope of the present invention as defined in the following claims. For example, while the invention has been described with reference to maximizing mobility for both the n and p devices, there may be product applications (such as SRAM cells) for which it may be desireable to maximize the carrier mobility for one device and not the other. Moreover, as previously stated, the invention applies to the fabrication of other devices such as capacitors or resistors, in which the freestanding body defines a semiconductor carrier path, and the "gate" consititutes a passing conductor or interconnecting conductor (depending on the nature of the element being fabricated).

What is claimed is:

1. A MOS device, comprising:
   first and second freestanding semiconductor bodies formed on a substrate, said first freestanding semiconductor body having a first portion thereof disposed at a non-orthogonal, non parallel orientation with respect to a first portion of said second freestanding semiconductor body, said portions of said first and second freestanding semiconductor bodies having respective first and second crystalline orientations;
   a first gate electrode crossing over at least part of said first portion of said first freestanding semiconductor body at a non-orthogonal angle with respect thereto; and
   a second gate electrode crossing over at least part of said first portion of said second freestanding semiconductor body at a non-orthogonal angle with respect thereto; and
   controlled electrodes disposed at least in portions of said first and second freestanding semiconductor bodies exposed by said first gate electrode and said second gate electrode, respectively.

2. The structure of claim 1 wherein said first and second freestanding semiconductor bodies are comprised of a material selected from the group consisting of silicon, germanium, compounds of silicon or germanium, and Group III–V materials, and Group II–IV materials.

3. The structure of claim 2 in which said first freestanding semiconductor body is at oriented at an angle of approximately forty-five degrees with respect to said second freestanding semiconductor body.

4. The structure of claim 3 wherein said first gate electrode crosses said first portion of said first freestanding semiconductor body at an angle of approximately sixty-seven and one-half degrees.

5. The structure of claim 4 wherein a channel region of said first freestanding semiconductor body is aligned with a {100} plane of said first semiconductor body, and a channel region of said second freestanding semiconductor body is aligned with a {110} plane of said second freestanding semiconductor body.

6. The structure of claim 5 wherein electrons are majority carriers in said channel region of said first freestanding semiconductor body, and holes are majority carriers in said channel region of said second freestanding semiconductor body.

7. A CMOS device, comprising:
   a first freestanding silicon body with a n-type channel region disposed on a first crystalline plane, and a first gate electrode that crosses over said channel region at a non-orthogonal angle with respect thereto, and source and drain regions;
   a second freestanding silicon body with a p-type channel region disposed on a second crystalline plane, and a second electrode that crosses over said channel region at a non-orthogonal angle with respect thereto, and source and drain regions.

8. The structure of claim 7 wherein said first crystalline plane is a {100} plane, and said second crystalline plane is a {110} plane.

9. The structure of claim 8 wherein said source and drain regions of said first freestanding semiconductor body are n-type dopant regions, and said source and drain regions of said second freestanding semiconductor body are p-type.

10. The structure of claim 8, wherein at least one of said first and second freestanding silicon bodies has at least one of said source and drain regions forming an orthogonal angle with respect to a respective one of said first and second gate electrodes.

11. The structure of claim 9, wherein each of said first and second freestanding silicon bodies have source and drain regions forming an orthogonal angle with respect to said first and second gate electrodes, respectively.

12. The structure of claim 8, wherein at least one of said first and second freestanding silicon bodies has a dogleg shape.

13. The structure of claim 8, wherein said first crystalline plane provides electron mobility that is greater than that of at least one other crystalline plane of silicon, and wherein said second crystalline plane provides hole mobility that is greater than that of said first crystalline plane.

14. A CMOS device, comprising:
   a first freestanding semiconductor body with a n-type channel region disposed on a first crystalline plane that has greater electron mobility than that of a second crystalline plane of said first freestanding semiconductor body, and a first gate electrode that crosses over said channel region at a non-orthogonal angle with respect thereto, and source and drain regions;
   a second freestanding semiconductor body with a p-type channel region disposed on a second crystalline plane that has a greater hole mobility than that of said first crystalline plane of said first freestanding semiconductor body, and a second electrode that crosses over said channel region at a non-orthogonal angle with respect thereto, and source and drain regions.

15. The structure of claim 14 wherein said semiconductor comprises silicon, said first crystalline plane is a {100} plane, and said second crystalline plane is a {110} plane.

16. The structure of claim 15 wherein said source and drain regions of said first freestanding semiconductor body are n-type dopant regions, and said source and drain regions of said second freestanding semiconductor body are p-type.

17. The structure of claim 14, wherein at least one of said first and second freestanding silicon bodies has at least one of said source and drain regions that form an orthogonal angle with respect to a respective one of said first and second gate electrodes.

18. The structure of claim 17, wherein each of said first and second freestanding silicon bodies have source and drain regions that form an orthogonal angle with respect to said first and second gate electrodes, respectively.

19. The structure of claim 14, wherein at least one of said first and second freestanding silicon bodies has a dogleg shape.

20. A method of forming a MOS device, comprising:
forming first and second freestanding semiconductor bodies formed on a substrate, said first freestanding semiconductor body having a first portion thereof disposed at a non-orthogonal, non parallel orientation with respect to a first portion of said second freestanding semiconductor body, said portions of said first and second freestanding semiconductor bodies having respective first and second crystalline orientations;
forming a first gate electrode crossing over at least part of said first portion of said first freestanding semiconductor body at a non-orthogonal angle with respect thereto; and
forming a second gate electrode crossing over at least part of said first portion of said second freestanding semiconductor body at a non-orthogonal angle with respect thereto; and
forming controlled electrodes in portions of said first and second freestanding semiconductor bodies exposed by said first gate electrode and said second gate electrode.

21. The method of claim 20 wherein said first and second freestanding semiconductor bodies are comprised of a material selected from the group consisting of silicon, germanium, compounds of silicon or germanium, and Group III–V materials, and Group II–IV materials.

22. The method of claim 20 in which said first freestanding semiconductor body is oriented at an angle of approximately forty-five degrees with respect to said second freestanding semiconductor body.

23. The method of claim 22 wherein said first gate electrode crosses said first portion of said first freestanding semiconductor body at an angle of approximately sixty-seven and one-half degrees.

24. The method of claim 23 wherein a channel region of said first freestanding semiconductor body is aligned with a {100} plane of said first semiconductor body, and a channel region of said second freestanding semiconductor body is aligned with a {110} plane of said second freestanding semiconductor body.

25. The method of claim 24 wherein electrons are majority carriers in said channel region of said first freestanding semiconductor body, and holes are majority carriers in said channel region of said second freestanding semiconductor body.

26. A method of forming a CMOS device, comprising:
forming a first freestanding semiconductor body with an n-type channel region disposed on a first crystalline plane that has greater electron mobility than that of a second crystalline plane of said first freestanding semiconductor body, and a first gate electrode that crosses over said channel region at a non-orthogonal angle with respect thereto; and
forming a second freestanding silicon body with a p-type channel region disposed on a second crystalline plane that has a greater hole mobility than that of said first crystalline plane of said first freestanding semiconductor body, and a second electrode that crosses over said channel region at a non-orthogonal angle with respect thereto.

27. The method of claim 26 wherein said first crystalline plane is a {100} plane, and said second crystalline plane is a {110} plane.

28. The method of claim 27 wherein said source and drain regions of said first freestanding semiconductor body are n-type dopant regions, and said source and drain regions of said second freestanding semiconductor body are p-type.

29. The method of claim 26, wherein at least one of said first and second freestanding silicon bodies has at least one of said source and drain regions forming an orthogonal angle with respect to a respective one of said first and second gate electrodes.

30. The method of claim 29, wherein each of said first and second freestanding silicon bodies have source and drain regions that form an orthogonal angle with respect to said first and second gate electrodes, respectively.

31. The method of claim 26, wherein at least one of said first and second freestanding silicon bodies has a dogleg shape.

32. A method of providing a densely integrated circuit comprising first and second finFETs with channel regions disposed on first and second crystal planes, comprising the steps of;
orienting a semiconductor wafer at a given axis;
forming a first set of mask shapes at a first azimuthal angle with respect to said given axis;
forming a second set of mask shapes at a second azimuthal angle with respect to said given axis;
forming finFet bodies in said semiconductor wafer by etching portions of the wafer exposed by said first and said second sets of mask shapes; and
forming gate electrodes over said finFet bodies at orientations that are favorable for lithographic control.

33. The method of claim 32 wherein said semiconductor comprises a material selected from the group consisting of silicon, germanium, compounds of silicon or germanium, and Group III–V materials, and Group II–IV materials.

34. The method of claim 33 wherein said semiconductor comprises silicon.

35. The method of claim 32, wherein said first azimuthal angle is at a first crystalline plane of said semiconductor in which electron mobility is higher than that of a second crystalline plane, and said second azimuthal angle is at a second crystalline plane of said semiconductor in which hole mobility is higher than that of said first crystalline plane.

36. The method of claim 35, wherein said semiconductor wafer has a {100} crystalline plane that is oriented substantially 45 degrees from a {110} plane.

37. The method of claim 32, wherein said first azimuthal angle is equal to and opposite of said second azimuthal angle.

38. The method of claim 37 wherein said first and said second fins are oriented +22.5 degrees and −22.5 degrees, respectively, from said semiconductor wafer axis.

39. A structure comprising
a first freestanding semiconductor body having a first conductive region laying on a first crystalline plane;
a second freestanding semiconductor body having a second conductive region laying on a second crystalline plane; and
first and second conductors that overlay said first and second conductive regions, respectively at non-orthonormal, non parallel angles with respect to said first and second conductive regions.

40. The structure of claim 39, wherein a dopant region is disposed in at least one of said first and second freestanding semiconductor bodies, respectively, at least a respective one of said first and second conductors having approximately 15% of its total length overlaying said dopant region.

41. The structure of claim 40, wherein said dopant region comprises a source diffusion of an FET, and said at least a respective one of said first and second conductors comprises a gate electrode of an FET.

42. The structure of claim 40, wherein said dopant region comprises a drain diffusion of an FET, and said at least a respective one of said first and second conductors comprises a gate electrode of an FET.

43. The structure of claim 39, further comprising a third freestanding semiconductor body, disposed at an orthonormal orientation with respect to one of said first and second freestanding semiconductor bodies.

* * * * *

UNITED STATES PATENT AND TRADEMARK OFFICE
CERTIFICATE OF CORRECTION

PATENT NO. : 6,794,718 B2
APPLICATION NO. : 10/248123
DATED : September 21, 2004
INVENTOR(S) : Edward J. Nowak and BethAnn Rainey It is certified that error appears in the above-identified patent and that said Letters Patent is hereby corrected as shown below:

On the title page item
(75) Inventors: Town of first-named inventor is misspelled; please correct Juction to Junction
OTHER PUBLICATIONS: On the title page item (56), lines, 3, 4, 5, 7, 8, 9 & 11
    I. Takagi et al.: (a) change Imuprity to Impurity; (b) change Transaction son to Transactions on; (c) change Devies to Devices.
    II. Takagi et al.: (a) change Uniersality to Universality; (b) Change Devies to Devices; (c) change pp. 233-2368 to pp. 2363-2368
    III. Tang et al.: (a) change Quasi-Planar-Gate to Quasi-Planar Double-Gate; (b) change Feb. 6, 2001, pp. 118-119, p. 437 to pp. 436-438
ABSTRACT: On the title page item (57),
    Line 4 of the abstract, please change non-orientation orthogonal to non-orthogonal
Page 2 under OTHER PUBLICATIONS: item (56), lines 2, 3, 4, 6, 7, & 10
    I. Hieda et al.: (a) change of to on (Transactions on Electron); (b) change Devies to Devices
    II. Shibahara et al.: (a) change IGDRAM to 1GDRAM: (b) change Technical Digest, International. 1994, pp. 639-642 to IEEE 0-7803-2111-1, IEDM 1994, pp. 639-642
    III. Hunter et al.: (a) change EDL-1 to EDL-2, No. 1
1. BACKGROUND OF THE INVENTION, column 1
    I. 2. Description of Related Art: 2nd paragraph, line 9, change Quasi-Planar to Quasi-Planar
    II. 2. Description of Related Art: 3rd paragraph, line 6, change {100} to {110}
1. DETAILED DESCRIPTION OF THE INVENTION, column 5
    I. 4th (last) paragraph beginning "In FIG. 5....", line 8, change (implant 74 to (implant 74)

UNITED STATES PATENT AND TRADEMARK OFFICE
CERTIFICATE OF CORRECTION

PATENT NO. : 6,794,718 B2
APPLICATION NO. : 10/248123
DATED : September 21, 2004
INVENTOR(S) : Edward J. Nowak and BethAnn Rainey It is certified that error appears in the above-identified patent and that said Letters Patent is hereby corrected as shown below:

2. DETAILED DESCRIPTION OF THE INVENTION, column 6
    I. 2nd paragraph beginning "Utilizing the process...", line 8, change Critical Image to Critical image Signed and Sealed this Twenty-second Day of January, 2008

JON W. DUDAS
*Director of the United States Patent and Trademark Office*